United States Patent
Randolph et al.

[11] Patent Number: 6,157,990
[45] Date of Patent: Dec. 5, 2000

[54] INDEPENDENT CHIP SELECT FOR SRAM AND DRAM IN A MULTI-PORT RAM

[75] Inventors: William L. Randolph; Dennis Blankenship, both of Durham; Rhonda Cassada, Hillsborough, all of N.C.

[73] Assignee: Mitsubishi Electronics America Inc., Cypress, Calif.

[21] Appl. No.: 09/012,460

[22] Filed: Jan. 23, 1998

Related U.S. Application Data

[60] Provisional application No. 60/040,053, Mar. 7, 1997.

[51] Int. Cl.[7] ........................................... G06F 13/00
[52] U.S. Cl. ..................... 711/154; 711/104; 711/149; 711/130; 711/131; 365/230.03
[58] Field of Search ................ 365/230.03; 711/104, 711/101, 154, 167

[56] References Cited

U.S. PATENT DOCUMENTS

| | | | |
|---|---|---|---|
| 5,561,781 | 10/1996 | Braceras et al. | 711/131 |
| 5,566,318 | 10/1996 | Joseph | 711/118 |
| 5,734,621 | 3/1998 | Ito | 365/230.03 |

*Primary Examiner*—David L. Robertson
*Attorney, Agent, or Firm*—Burns, Doane, Swecker & Mathis, L.L.P.

[57] ABSTRACT

A multi-port RAM (MPRAM) having a SRAM and a DRAM on a single chip. Separate pins are provided on the chip to supply independent chip select signals for the SRAM and the DRAM. When the SRAM chip select signal is at a high level, a clock generator is prevented from producing an internal clock signal for the SRAM. As a result, no SRAM operation is performed in response to a SRAM command. Similarly, when the DRAM chip select signal is high, a clock generator produces no internal clock signal for the DRAM. As a result, DRAM operations are prevented from being performed in response to DRAM commands.

11 Claims, 3 Drawing Sheets

INDEPENDENT CHIP SELECT FOR SRAM AND DRAM IN A MULTI-PORT RAM

This application claims the benefit of U.S. Provisional Application No. 60/040,053 filed Mar. 7, 1997.

TECHNICAL FIELD

This application relates to memory devices and, in particular, to a multi-port random access memory (MPRAM) that incorporates independent chip select for a static random access memory (SRAM) and a dynamic random access memory (DRAM).

BACKGROUND ART

The development of computer graphics system creates the need for fast memories capable of storing huge amounts of data, such as 3-D graphics data. Among such memories are cached memories developed to improve DRAM main memory performance by utilizing a faster SRAM cache memory. For example, U.S. Pat. No. 5,566,318 discloses an enhanced DRAM that integrates a SRAM cache memory with a DRAM on a single chip. Sense amplifiers and column write select registers are coupled between the SRAM cache and the DRAM memory array. A column decoder is associated with the SRAM cache for providing access to the desired column of the SRAM. A row decoder is associated with the DRAM memory array to enable access to particular rows of the DRAM. Input/output control and data latches receive data from the SRAM to provide data output via data input/output lines. The current row of data being accessed from the DRAM memory array is held in the SRAM cache memory. Should a cache "miss" be detected, the entire cache memory is refilled from the DRAM memory array over a DRAM-to-cache memory bus.

The speed of data reading and writing in a RAM is limited due to switching delays between the moment the RAM is activated and the instant valid data appear at the input or output. For example, a DRAM read operation may be activated by switching the row address strobe /RAS and the column address strobe /CAS to a low level. For example, the delay in data reading is determined by the RAS latency that corresponds to the delay between the instant the /RAS signal goes low and the moment valid data appear at the output.

It would be desirable to provide independent concurrent DRAM and SRAM operations, in order to continue SRAM writing or reading operations after a DRAM operation is activated. This would increase the bandwidth of data transfer in the RAM by eliminating RAM switching delays caused by the RAS latency.

In synchronous memories, a chip select signal /CS is used to disable the internal clock when the current command should be ignored, for example in a No Operation (NOP) mode. As illustrated in FIG. 1, for supporting input or output of data DQ, a synchronous memory may use such input command signals as row and column address strobes /RAS and /CAS, write enable command /WE, or an operation control signal /DSF. The chip select signal /CS is supplied at the rising edge of the system clock CLK to validate or invalidate the input command signals produced at the same rising edge of the system clock.

For example as shown in FIG. 1, the chip select signal /CS set at a high level (/CS=H) may indicate that the corresponding input command signal should be ignored. In this case, the internal clock of the synchronous memory (Internal CLK) to be produced in the next system clock cycle is disabled. As a result, the corresponding input command is not executed. When the chip select signal /CS is set at a low level (/CS=L), the internal clock is produced to support an operation defined by the corresponding input command.

However, a single chip select signal cannot support independent operations of SRAM and DRAM arranged on the same chip. Therefore, it would be desirable to provide a chip select system that allows a user to perform SRAM and DRAM operations independently.

Moreover, in a graphics subsystem, multiple memory chips connected in parallel are required for storing data. In such a multi-chip memory system, each two memory chips may be combined into a memory bank. As all the input command signals are supplied in parallel to every bank in the memory system, a single chip select signal would not allow DRAM and SRAM operations in the memory banks to be performed independently. For example, a DRAM transfer in bank 1 will be initiated in response to a request for a DRAM operation in bank 2.

Therefore, it would be desirable to provide a chip select system that would support independent DRAM and SRAM operations in a multi-chip memory system.

DISCLOSURE OF THE INVENTION

Accordingly, one advantage of the invention is in providing a multi-port memory chip that supports independent concurrent DRAM and SRAM operations.

Another advantage of the invention is in providing a multi-port memory chip having a chip select system that allows a user to perform independent SRAM and DRAM operations within a single memory chip or in a multi-chip memory system.

The above and other advantages of the invention are achieved, at least in part, by providing a memory device having at least one external data port, a main memory and a cache memory arranged on a single chip. A first chip select line receives a first chip select signal to prevent the main memory from executing external commands when the first chip select signal is in a first logic state and to enable the main memory to execute the external commands when the first chip select signal is in a second logic state. A second memory chip select line receives a second chip select signal independent of the first memory chip select signal to prevent the cache memory from executing the external commands when the second chip select signal is in a first logic state and to enable the cache memory to execute the external commands when the second chip select signal is in a second logic state. The main memory may comprise a DRAM, and the cache memory may comprise a SRAM.

In accordance with a preferred embodiment of the invention, a clock generator is coupled to the first and second chip select lines for receiving the first and second chip select signals.

The clock generator is prevented from producing a main memory internal clock signal when the first chip select signal is in the first logic state. However, the clock generator is enabled to produce the main memory internal clock signal when the first chip select signal is in the second logic state.

Furthermore, the clock generator is prevented from producing a cache memory internal clock signal when the second chip select signal is in the first logic state, but is enabled to produce the cache memory internal clock signal when the second chip select signal is in the second logic state.

The external commands may comprise main memory commands supplied to the main memory, and cache memory commands supplied to the cache memory. The main memory is prevented from executing the main memory commands when the first chip select signal is in the first logic state. Similarly, the cache memory is prevented from executing the cache memory commands when the second chip select signal is in the first logic state.

In accordance with a method of the present invention, the following steps are carried out to support data transfer:

supplying a first chip select signal for preventing the first memory from executing first external commands when the first chip select signal is in a first logic state, and for enabling the first memory to execute the first commands when the first chip select signal is in a second logic state, and independently of the first chip select signal, supplying a second chip select signal for preventing the second memory from executing second external commands when the second chip select signal is in a first logic state, and for enabling the second memory to execute the second external commands when the second chip select signal is in a second logic state.

The method of the present invention may further comprise the steps of preventing a first internal clock signal from being produced in response to a master clock signal when the first chip select signal is in the first logic state, and producing the first internal clock signal in response to the master clock signal when the first chip select signal is in the second logic state.

Similarly, a second internal clock signal may be prevented from being produced in response to the master clock signal when the second chip select signal is in the first logic state. However, the second internal clock signal is produced in response to the master clock signal when the second chip select signal is in the second logic state.

These and other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Figure 1:
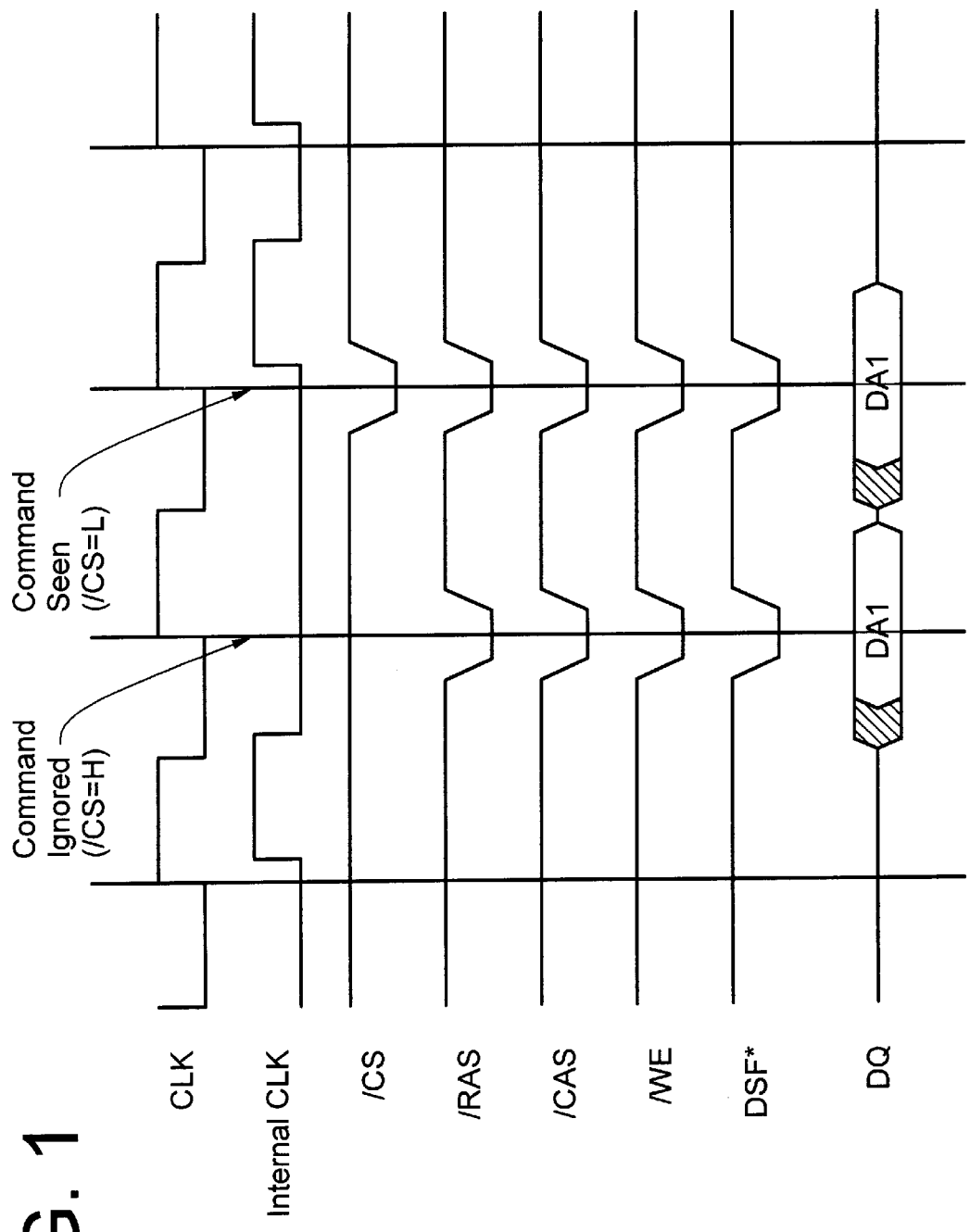
FIG. 1 illustrates conventional way of supplying a chip select signal with input commands.
Figure 2:
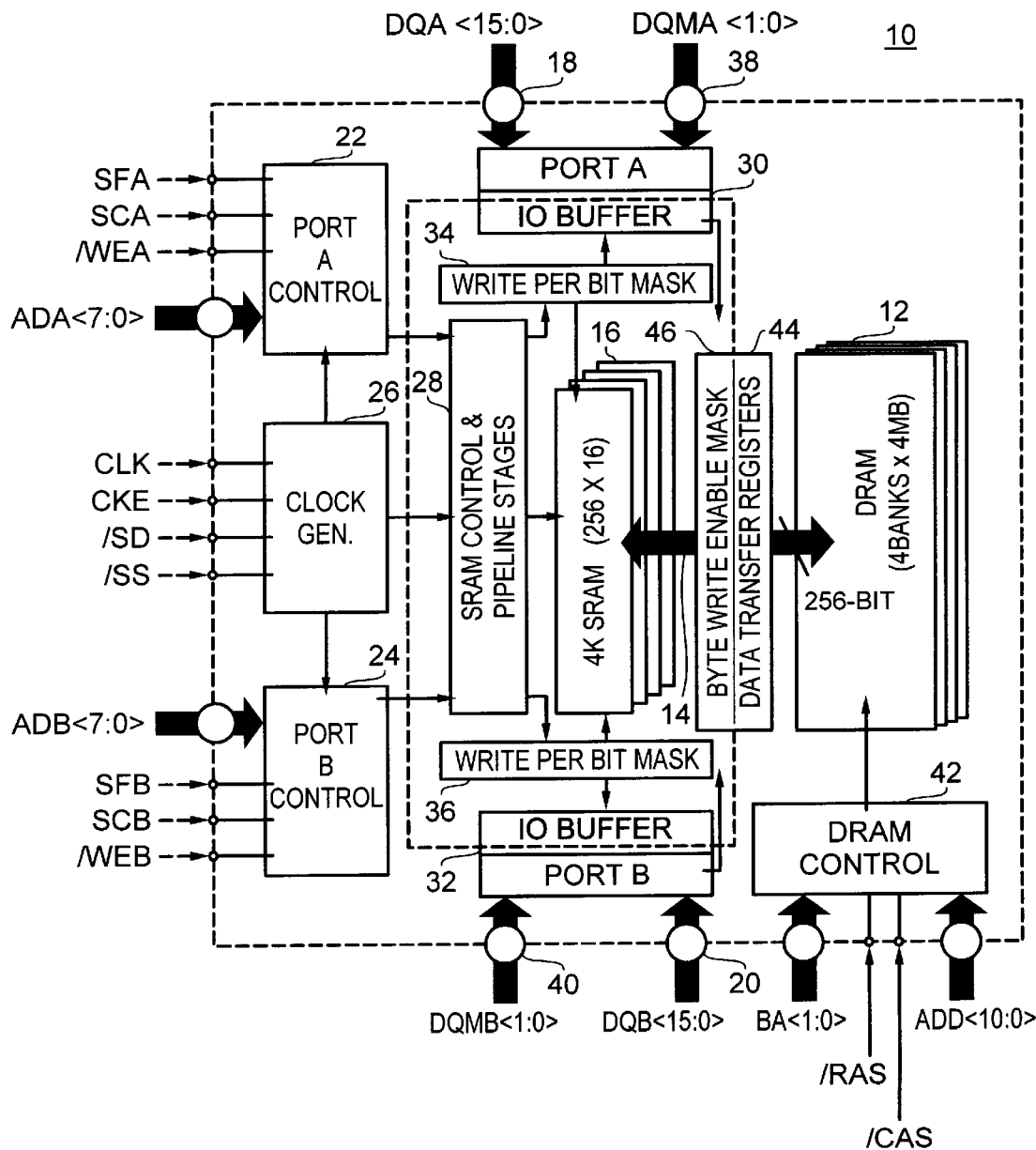
FIG. 2 is a block diagram illustrating architecture of a multi-port RAM chip of the present invention.

Although the invention has general applicability in the field of memory devices, the best mode for practicing the invention is based in part on the realization of a multi-port RAM (MPRAM) 10 illustrated in FIG. 2. The MPRAM 10 arranged on a single chip comprises a DRAM 12 divided into four independently addressable memory banks of 4 Mbits each. Each bank contains a memory array organized as 512 rows by 32 columns by 256 bits. As discussed in more detail later, a single 256-bit global input-output (IO) bus 14 is shared by all 4 banks of the DRAM 12, and connects the DRAM 12 to a SRAM 16.

The 4 K-bit SRAM 16 may be organized as 16 lines by 16 words by 16 bits. Each 256-bit transfer between the DRAM 12 and the SRAM 16 replaces or updates one of 16 lines in the SRAM 16.

The MPRAM 10 has two identical and independent 16-bit IO ports A and B. Each of the ports A and B provides read and write accesses to each cell of the SRAM 16. IO data pins 18 and 20 are respectively connected to the ports A and B for providing input and output of 16-bit data DQA and DQB. External 16-bit IO bus may be connected to each of the data pins 18 and 20 for writing and reading data to and from the MPRAM 10.

SRAM control signals SCA and SCB for the ports A and B, respectively, are supplied via a port A control circuit 22 and a port B control circuit 24 to define SRAM operations such as data read or write, and burst termination. Write enable commands /WEA and /WEB for the ports A and B are provided via the port control circuits 22 and 24, respectively, to decode SRAM write and read operations. Also, the port control circuits 22 and 24 may receive special function commands SFA and SFB, respectively, for enabling a write per bit mode of operation, and to provide burst termination.

A clock generator 26 supplied with a master clock signal CLK provides internal clocks for MPRAM operations. All input signals of the MPRAM are referenced to the rising edge of the master clock CLK. A master clock enable signal CKE is fed into the clock generator 26 to enable the internal clock generation. Separate chip select signals /SD and /SS provide chip select functions for the DRAM 12 and the SRAM 16, respectively. As discussed in more detail later, the separate chip select signals allows DRAM and SRAM operations to be performed independently.

The port control circuits 22 and 24, and the clock generator 26 are coupled to a SRAM control circuit 28 that controls write and read accesses to the SRAM 16. The data transfer path between each of the IO data pins 18 and 20 and the SRAM 16 for data writing or reading is arranged as a two-stage pipeline.

To write data into the SRAM 16, write commands WA and WB for ports A and B, respectively, may be issued by the SRAM control circuit 28 on the first clock cycle, and the data to be written is supplied on the second clock cycle. The addressed line and word of the SRAM 16 is determined by 8-bit address signals ADA and ADB for ports A and B, respectively, supplied to the port control circuits 22 and 24. For example, the addressed line may be defined by four high-order bits of the address signals ADA and ADB, and the addressed 16-bit word may be determined by four low-order bits of the address signals ADA and ADB.

For reading data from the SRAM 16, read commands RA and RB may be issued by the SRAM control circuit 28 on the first clock cycle, the data is accessed at the second clock's rising edge, and the data is made valid on the third clock cycle. Similarly to writing operations, the addressed line and word of the SRAM 16 is determined by the address signals ADA and ADB for ports A and B, respectively. For example, the addressed line may be defined by four high-order bits of the address signals ADA and ADB, and the addressed 16-bit word may be determined by four low-order bits of the address signals ADA and ADB.

The ports A and B are independent and may simultaneously provide reading and writing data from or to any location in the SRAM 16. However, the user is prevented from writing to the same SRAM cell from both ports simultaneously. IO buffers 30 and 32 are coupled to the ports A and B, respectively, to buffer data during read and write operations.

Write per bit mask registers 34 and 36 connected to the IO buffers 30 and 32, respectively, are used to perform masked write operations from ports A and B. The SRAM control circuits issues masked write commands MWA and MWB for ports A and B, respectively, to mask the DQA and DQB data being written into the SRAM 16. Pins 38 and 40 supplies two-bit mask control data DQMA and DQMB for ports A and B, respectively. When either bit of the mask control data DQMA and DQMB is set high, the DQA and DQB data, respectively, being read or written is masked. For example, the high-order bit of the mask control data DQMA and DQMB respectively controls the upper byte of the DQA and DQB data. The low-order bit of the mask control data DQMA and DQMB may respectively control the lower byte of the DQA and DQB data. Load mask register commands LMRA and LMRB may be issued by the SRAM control circuit 28 for ports A and B, respectively, to load the write per bit registers 34 and 36.

The MPRAM 10 allows the SRAM 16 and DRAM 12 to operate concurrently. A DRAM control circuit 42 forms DRAM control commands defined by control signals /RAS and /CAS. A 2-bit bank address command BA selects one of four DRAM banks. An 11-bit address command ADD select DRAM row and column addresses, DRAM transfer operations and lines in the SRAM 16 from which data may be transferred to the DRAM 12 or to which data may be transferred from the DRAM 12. For example, nine low-order bits of the ADD command may select DRAM row address, five low-order bits may select DRAM column address, two bits of the ADD command may be used to define DRAM transfer operation, and four high-order bits may select one of sixteen lines in the SRAM.

The DRAM control circuit 42 forms a DRAM read transfer command DRT to transfer 1 of 32 blocks of data indicated by the ADD command into 1 of 16 lines in the SRAM 16. A DRAM write transfer command DWT is formed by the DRAM control circuit 42 to transfer data from 1 of 16 SRAM lines indicated by the ADD command to 1 of 32 blocks in the DRAM 12.

Data transfer registers 44 are arranged between the DRAM 12 and SRAM 16 to support data transfer between the DRAM 12 and SRAM 16. A 32-bit byte write enable mask register 46 is used to mask DRAM write transfers. The register 46 may be loaded from either port A or port B when the load mask register command LMR is issued. Each bit in the register 46 masks a byte of the 256-bit global IO bus 14. The byte write enable mask register 46 and write per bit mask registers 34 and 36 may be bypassed during writes to the DRAM 12 and SRAM 16, respectively. Data transfers between the SRAM 16 and the DRAM 12 via the global IO bus 16 are disclosed in more detail in our copending application Ser. No. 08/937,004, entitled "MULTI-PORT RAM HAVING SHARED GLOBAL BUS"0 filed on Sep. 24, 1997 and incorporated herewith by reference.

The MPRAM 10 has a programmable burst mode that allows the user to select burst lengths of 1, 2, 4 and 8 for bursts of data being written from the ports A and B to the SRAM 16 or bursts of data being read from the SRAM 16 to the ports A and B. Sequential or interleave bursts may be selected. A set mode register command SMR issued by the DRAM control circuit 42 enables the burst length and type to be programmed in an internal mode register. A mode register code (MRC) to be programmed in the mode register may be entered using the ADD command. The MRC is stored in the mode register until it is overwritten by the next SMR command, or until power is no longer supplied to the MPRAM 10. The SMR command may be issued when the DRAM 12 and SRAM 16 are in an idle state. Burst terminate commands BTA and BTB may be issued by the SRAM control circuit 28 to terminate burst sequences from or to the ports A and B, respectively.

As discussed above, the MPRAM 10 allows the DRAM 12 and SRAM 16 arranged on the same integrated circuit to operate independently. DRAM operations are controlled by DRAM control signals supplied from the DRAM control circuit 42 to allow data to move between each of the DRAM banks 12A–12D and the SRAM 16 via the global bus 14. The DRAM control signals include a row address strobe /RAS, a column address strobe /CAS, a 2-bit bank address command BA, and an 11-bit address ADD.

The combination of the /RAS and /CAS signals, together with some address bits ADD, defines various DRAM operations, such as a read transfer from a selected DRAM bank 12A–12D into a selected line in the SRAM 16, a write transfer from a selected line in the SRAM 16 to a selected DRAM bank 12A–12D, and a precharge operation performed to precharge or deactivate a selected bank.

The 2-bit bank address command BA selects one of the four banks 12A–12D for an operation defined by the /RAS and /CAS signals. In addition to selecting specific DRAM operations, the ADD bits define row and column addresses of the DRAM banks 12A–12D, and select one of 16 lines in the SRAM from which data will be transferred to the DRAM 12 or to which data will be transferred from the DRAM 12.

When a DRAM write cycle occurs, a 256-bit block of data is loaded from the SRAM 12 onto the global bus 14 which transfers the data block to a selected 256-bit DRAM page indicated by the DRAM column address. The selected page is located in the DRAM bank indicated by the bank address BA.

During a DRAM read transfer, a 256-bit data block indicated by the row and column addresses is read from a DRAM bank 12A–12D selected by the bank address, and placed on the global bus 14 which transfers the data block to the selected SRAM line.

The SRAM 16 has two "external" IO ports for enabling access by an external device, and one "internal" IO port coupled to the global bus 14. This arrangement allows the MPRAM 10 to perform read and write accesses to the SRAM 16 from both ports A and B simultaneously with read and write accesses to the DRAM 12 via the global bus 14.

Ability to perform concurrent SRAM and DRAM operations enables the MPRAM 10 to continue writing and reading to and from the SRAM 16 after a DRAM read or write operation is activated by the /RAS signal. Thus, the RAS latency does not delay reading and writing operations performed by the external controller.

SRAM operations are controlled by the command signals SCA and SCB for ports A and B, respectively, supplied via the port A control circuit 22 and the port B control circuit 24. The write enable commands /WEA and /WEB for the ports A and B, respectively enable the control circuits 22 and 24 to decode SRAM write and read operations. The special function commands SFA and SFB for ports A and B, respectively, may control SRAM operations in a masking or burst modes.

Byte masking for each of ports A and B is controlled by the DQMA and DQMB signals, respectively. When either bit of the mask control data DQMA or DQMB is set high, the byte masking circuit 106 masks a corresponding byte of the DQA or DQB data is being masked.

To enable the user to perform the DRAM and SRAM operations independently, the MPRAM 10 has two independent chip select pins, one of which receives a DRAM chip select signal /SD, and the other is supplied with a SRAM chip select signal /SS. The /SD and /SS signals are supplied to the clock generator 26, which produces separate internal clocks for the DRAM 12 and SRAM 16 in response to the master clock CLK.

Figure 3:
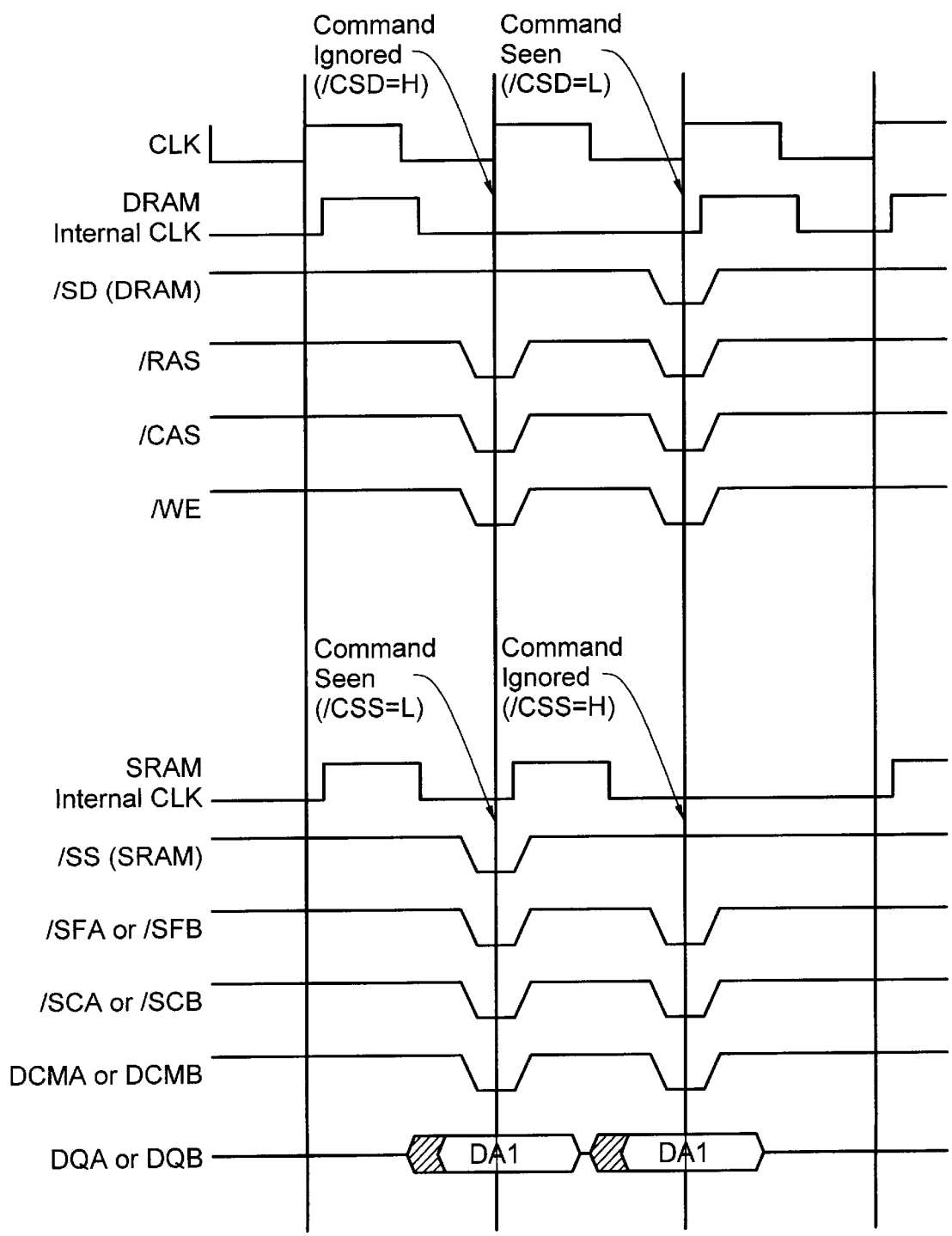
FIG. 3 illustrates separate chip select signals for SRAM and DRAM on the multi-port RAM chip.

As illustrated in FIG. 3, the DRAM chip select signal /SD controls the clock generator 26 to produce the DRAM internal clock, and the SRAM chip select signal /SS controls the clock generator 26 to produce the SRAM internal clock. The /SD and /SS signals are sampled at a rising edge of the master clock CLK. If the /SD signal is set high at any rising edge of the master clock CLK, the clock generator 26 is prevented from producing the DRAM internal clock in the clock cycle that follows the rising edge. When the /SD signal is set low at any rising edge of the master clock CLK, the DRAM internal clock is produced in response to this rising edge.

The DRAM command signals, such as the /RAS, /CAS and /WE signals, are latched at the rising edge of the master clock CLK. When no DRAM internal clock is produced in the clock cycle that follows this rising edge, the DRAM command signals are ignored. As a result, no DRAM transfer operations are performed. However, when the /SD signal enables the clock generator 26 to produce the DRAM internal clock, corresponding DRAM transfer operations are performed in response to the DRAM command signals.

As discussed above, the SRAM commands for port A or port B include the /SFA or /SFB command, the /SCA or /SCB command, and DCMA or DCMB command. These commands are also latched at the rising edge of the master clock CLK.

When the /SS signal is set low at any rising edge of the master clock CLK, the clock generator 26 is enabled to produce the DRAM internal clock in response to this rising edge. As a result, the SRAM commands latched at this rising edge are performed.

However, if the /SS chip select signal is set high at a rising edge of the master clock CLK, the clock generator 26 is prevented from generating the DRAM internal clock in the clock cycle that follows this rising edge. Accordingly, the SRAM commands latched at this rising edge are ignored, and initiate no SRAM operations.

Thus, separate and independent chip select signals /SD and /SS allow the user to control DRAM and SRAM operations independently. For example, the user may perform a SRAM operation without a DRAM operation, or initiate the transfer of data stored in the SRAM 16 to the DRAM 12 without writing new data to the SRAM 16.

Separate independent chip select signals for SRAM and DRAM are particularly useful when multiple MPRAM chips are connected in parallel for storing data. Each two MPRAM chips may be combined into a memory bank.

As all the SRAM and DRAM command signals are supplied in parallel to every bank in the memory system, two separate chip select signals for every chip allow the user to perform SRAM and DRAM operations in one MPRAM bank independently of SRAM and DRAM operations in another MPRAM bank. For example, a DRAM operation may be performed in one MPRAM bank, while another MPRAM bank carries out a SRAM operation.

A single chip select signal would not allow DRAM and SRAM operations in the memory banks to be performed independently. For example, a request for DRAM transfer in one MPRAM bank concurrently issued with a SRAM operation in a second MPRAM bank would cause the DRAM transfer to occur in the first and second bank in the case of a single chip select for an MPRAM.

There accordingly has been described a multi-port RAM (MPRAM) having a SRAM and a DRAM on a single chip. Separate pins are provided on the chip to supply independent chip select signals for the SRAM and the DRAM. When the SRAM chip select signal is at a high level, a clock generator is prevented from producing an internal clock signal for the SRAM. As a result, no SRAM operation is performed in response to a SRAM command. Similarly, when the DRAM chip select signal is high, a clock generator produces no internal clock signal for the DRAM. As a result, DRAM operations are prevented from being performed in response to DRAM commands.

In this disclosure, there are shown and described only the preferred embodiments of the invention, but it is to be understood that the invention is capable of changes and modifications within the scope of the inventive concept as expressed herein.

What is claimed is:

1. A memory device comprising on a single chip:
   at least one external data port for providing data input and output,
   a main memory for storing data,
   a cache memory coupled between said data port and said main memory for providing data transfer between said data port and said main memory, and having smaller storage capacity than said main memory,
   a first chip select line for receiving a first chip select signal to prevent said main memory from executing external commands when said first chip select signal is in a first logic state and to enable said main memory to execute said external commands when said first chip select signal is in a second logic state,
   a second memory chip select line for receiving a second chip select signal independent of said first memory chip select signal to prevent said cache memory from executing said external commands when said second chip select signal is in a first logic state and to enable said cache memory to execute the external commands when said second chip select signal is in a second logic state, and
   a clock generator coupled to the first and second chip select lines for receiving the first and second chip select signals,
   wherein the clock generator is prevented from producing a main memory internal clock signal when the first chip select signal is in the first logic state, and is enabled to produce the main memory internal clock signal when the first chip select signal is in the second logic state, and the clock generator is prevented from producing a cache memory internal clock signal when the second chip select signal is in said first logic state, and is enabled to produce the cache memory internal clock signal when the second chip select signal is in the second logic state.

2. The memory device of claim 1, wherein said main memory comprises a DRAM, and said cache memory comprises a SRAM.

3. The memory device of claim 1, wherein said external commands comprise main memory commands supplied to said main memory, and cache memory commands supplied to said cache memory.

4. The memory device of claim 3, wherein said main memory is prevented from executing said main memory commands when said first chip select signal is in said first logic state.

5. The memory device of claim 4, wherein said main memory is enabled to execute said main memory commands when said first chip select signal is in said second logic state.

6. The memory device of claim 5, wherein said cache memory is prevented from executing said cache memory commands when said second chip select signal is in said first logic state.

7. The memory device of claim 6, wherein said cache memory is enabled to execute said cache memory commands when said second chip select signal is in said second logic state.

8. The memory device of claim 7, wherein said main memory and said cache memory are arranged to operate independently of each other in response to said main memory commands and said cache memory commands.

9. The memory device of claim 8, wherein said main memory and said cache memory are arranged to operate concurrently with each other in response to said main memory commands and said cache memory commands.

10. The memory device of claim 1, comprising first and second data ports for providing data input and output independently of each other.

11. In a memory device having on a single chip at least one external input/output data port, a main memory, and a cache arranged to provide data transfer between the main memory and the data port, a method of data transfer comprising the steps of:

supplying a first chip select signal for preventing said main memory from executing first external commands when said first chip select signal is in a first logic state, and for enabling said main memory to execute the first commands when said first chip select signal is in a second logic state, independently of said first chip select signal, supplying a second chip select signal for preventing said cache memory from executing second external commands when said second chip select signal is in a first logic state, and for enabling said cache memory to execute said second external commands when said second chip select signal is in a second logic state, preventing a main memory internal clock signal from being produced in response to a master clock signal when the first chip select signal is in the first logic state and producing the main memory internal clock signal in response to the master clock signal when the first chip select signal is in the second logic state, and preventing a cache memory internal clock signal from being produced in response to the master clock signal when the second chip select signal is in the first logic state and producing the cache memory internal clock signal in response to the master clock signal when the second chip select signal is in the second logic state.

* * * * *

UNITED STATES PATENT AND TRADEMARK OFFICE
CERTIFICATE OF CORRECTION

PATENT NO. : 6,157,990

DATED : December 5, 2000

INVENTOR(S) : Randolph et al.

It is certified that error appears in the above-identified patent and that said Letters Patent is hereby corrected as shown below:

Column 8, line 53, delete "chin" and insert therefor --chip--.

Signed and Sealed this

Eighth Day of May, 2001

*Attest:*

NICHOLAS P. GODICI

*Attesting Officer*      *Acting Director of the United States Patent and Trademark Office*